Figure 1:
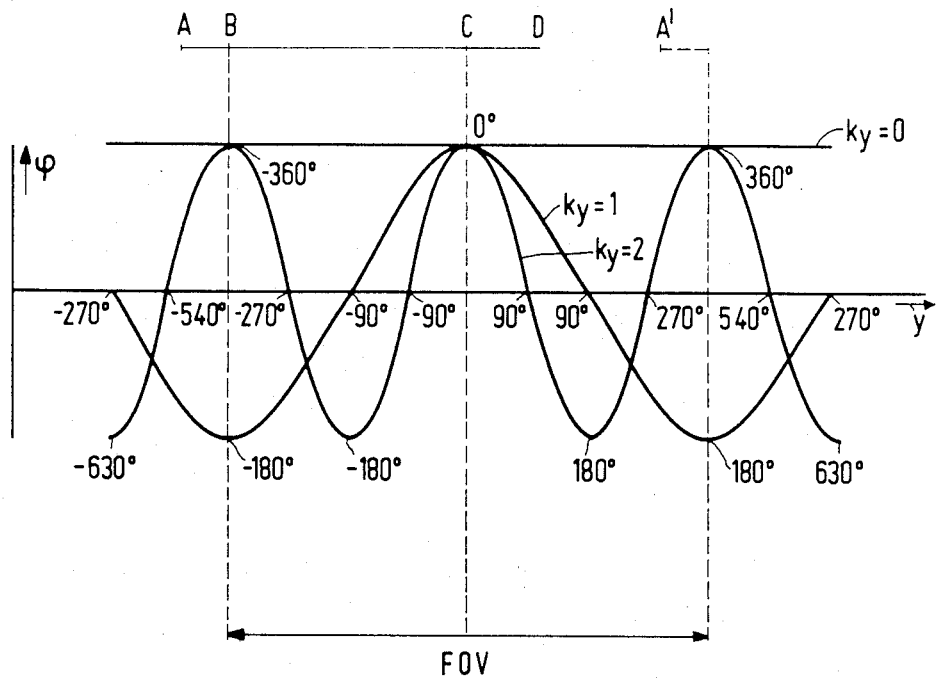

United States Patent [19]

Van Der Meulen et al.

[11] Patent Number: 4,849,698

[45] Date of Patent: Jul. 18, 1989

[54] METHOD OF REDUCING MR IMAGE ARTEFACTS IN OFF-CENTER IMAGES

[75] Inventors: Peter Van Der Meulen; Filips Van Liere, both of Eindhoven, Netherlands

[73] Assignee: U.S. Philips Corporation, New York, N.Y.

[21] Appl. No.: 73,679

[22] Filed: Jul. 14, 1987

[30] Foreign Application Priority Data

Jul. 15, 1986 [NL] Netherlands ............... 8601845

[51] Int. Cl.$^4$ ................................... G01R 33/20
[52] U.S. Cl. ................................... 324/309
[58] Field of Search ............... 324/307, 309, 311, 312, 324/314

[56] References Cited

U.S. PATENT DOCUMENTS

| | | | |
|---|---|---|---|
| 4,567,893 | 2/1986 | Charles et al. | 324/309 |
| 4,593,247 | 6/1986 | Glover | 324/309 |
| 4,599,565 | 7/1986 | Hoenninger, III et al. | 324/309 |
| 4,612,504 | 9/1986 | Pelc | 324/309 |
| 4,616,182 | 10/1986 | Kramer et al. | 324/309 |
| 4,649,347 | 3/1987 | Hwang et al. | 324/309 |
| 4,682,110 | 7/1987 | DenBoef | 324/309 |
| 4,698,592 | 10/1987 | Feinberg | 324/309 |

OTHER PUBLICATIONS

"Proton NMR Tomography", Locher, P. R., Philips Technical Review, vol. 41, 1983/1984, No. 3, p. 73 of seq.

Primary Examiner—Stewart J. Levy
Assistant Examiner—Kevin D. O'Shea
Attorney, Agent, or Firm—Thomas A. Briody; Jack E. Haken; Jack D. Slobod

[57] ABSTRACT

A method is proposed for the elimination of the effect of coherent interference signals which give rise to image artefacts in off-center imaging which usually requires roll correction in order to obtain a correct image. To this end, the image is shifted independently with respect to the artefact signal over an arbitrary distance which depends on the isocentric shift. The method is advantageous for off-center imaging where usually surface coils are used. A band of interference signals in the phase encoding direction can thus be shifted to the edge of the image.

2 Claims, 2 Drawing Sheets

METHOD OF REDUCING MR IMAGE ARTEFACTS IN OFF-CENTER IMAGES

The invention relates to a method of determining a nuclear magnetization distribution from magnetic resonance signals which are generated in measurement cycles in a body which is situated in a steady, uniform magnetic field, first spin nuclei being excited in the body during each cycle by applying at least one RF pulse followed by the application of at least one magnetic preparation gradient which is superposed on the uniform magnetic field for the phase encoding of the excited spin nuclei in at least one direction, after which a resonance signal is generated from the excited spin nuclei by the application of further RF pulses and/or further magnetic field gradients, said resonance signal being sampled in order to obtain signal samples which are stored in a first dimension of a data matrix, at least a second dimension of which is determined by the strength of the at least one magnetic preparation gradient, additional phase differences being induced in the cycles during the excitation of the spin nuclei.

The term nuclear magnetization distribution is to be understood to have a broad meaning in the present context; inter alia terms such as spin density distribution, longitudinal relaxation time distribution, transverse relaxation time distribution and spin resonance frequency spectrum distribution (NMR location-dependent spectroscopy) are considered to be covered by the term nuclear magnetization distribution.

A method and device of this kind are known from European patent application No. EPO155052 (HN 10970), corresponding to U.S. Pat. No. 4,682,110, granted July 21, 1987 and assigned to the same assignee as the present application. In order to obtain a two-dimensional or three-dimensional NMR image, inter alia a so-called spin echo measurement is described therein. In the two-dimensional version of the spin echo measurement, spin nuclei are excited each cycle by means of a so-called 90° excitation pulse, the spin nuclei being phase encoded in one direction by the application of the preparation gradient. Subsequently, a 180° echo pulse is applied as a further RF pulse for inverting the magnetization caused by the excitation and for rephasing the spin nuclei. A spin echo signal then appearing is sampled. The preparation gradient comprises a number of steps. In accordance with the known method, additional phase differences are induced during the excitation for successive steps of the preparation gradient. In particular, an alternating phase is imparted to the excitation pulse for successive cycles. The signal samples obtained by sampling of the spin echo signals are stored in the data matrix. Upon execution of the method, interference signals are present in the direction of the preparation gradient which are not correlated to the preparation gradient. These so-called coherent interference signals are inter alia DC-offset or DC-offset drift in amplifiers of the device or undesirable resonance signals (spurious FIDs) due to imperfect 180° echo pulses. In accordance with the known method it is achieved that, after Fourier transformation of the signal sample, the artefacts occuring due to the coherent interference signals in an unmodified spin echo measurement are shifted towards the edge of the image. For a more detailed description of a spin echo measurement and an MR device, reference is made to an article by P. R. Locher, "Proton NMR Tomography", "Philips Technical Review", Vol. 41, No 3, 1983/84, pages 73-88. The description of the apparatus, pulse sequences and image reconstruction method in the article by Locher is assumed to be incorporated in the present Patent Application.

One drawback of the known method consists in that it fails in the case of so-called "off-centre imaging". This is a method of MR imaging where, for example a surface coil is used for the excitation of a region of a body and/or for the reception of resonance signals, a sensitivity centre of said coil not being coincident with an excitation isocentre of the MR device. The excitation isocentre is the point in the MR device in which all magnetic field gradients have the value zero when they are applied. The need for "off-centre imaging" with surface coils will usually be great, for example in order to enable measurement of a local area of the body with a high signal to noise ratio. When the preparation gradient is activated, a phase shift of $2\pi$ will occur over a given distance for a strength of the preparation gradient over one gradient step in the preparation gradient direction, symmetrically with respect to the isocentre. This distance is referred to as the field of view. Over larger distances, the phase shift will no longer be unambiguous; the phase shift is cyclical with $2\pi$, the field of view is periodic. This has consequences for the phase encoding and the formation of images from signal samples of resonance signals. A body in which spin nuclei are excited beyond the field of view will produce an image which will require roll corection in order to obtain a correct image. This roll correction is the regrouping of image lines which are situated outside a field of view with respect to image lines situated therewithin. In the case of off-centre imaging by means of a surface coil, requiring roll correction, an interference line will generally extend across image information when a spin echo measurement is performed in the presence of coherent interference signals. When use is made of the known method of inducing additional phase differences during excitation, the interference line will not be shifted to the edge but will remain present inside the image.

It is the object of the invention to provide a method which does not have the described drawback. A method of the kind set forth is characterized in that the resonance signals are generated from spin nuclei which are excited in a shifted fashion with respect to an excitation isocentre and which are situtated at least partly outside a field of view of the one preparation gradient, the additional phase differences being chosen so that, after application of roll correction, coherent interference signals occurring during the cycles in an image obtained from the data matrix by Fourier transformation are shifted to an edge of the image. Thus, it is achieved that in the case of off-centre imaging the interference line in an image caused by a coherent interference signal, is shifted to the edge of the image. The method is based on the recognition of the fact that an image resulting from Fourier MR imaging can be shifted to an arbitrary position without loss of information, this idea is based on the Fourier shift theorem and the fact that the shift is cyclical. With respect to interference lines occurring in the isocentre, therefore, the image can always be shifted so that the interference lines disappear from the image. In the case of a three-dimensional version, the interference lines will be shifted to the edge of an outer plane or in a different manner to a boundary of a volume to be measured, depending on the sequence of the Fourier operations. The remainder of the operation is analogous to the description given in the cited European Patent Application EPO155052.

It is also to be noted that European patent application Nos. EPO145277 and EPO182267 which correspond, respectively, to U.S. Pat. Nos. 4,616,182 and 4,612,504 also involve phase alternation upon excitation. However, the same drawback exists as for said patent application No. EPO155052.

A version of a method in accordance with the invention is characterized in that in the case of bandwidth limited coherent interference signals the field of view is proportioned with respect to the body so that the bandwidth limited coherent interference signals in the image are shifted to a position outside the nuclear magnetization distribution of the body. When the field of view in the phase encoding direction covers a distance which is larger than a region of the body to be excited in the phase encoding direction, there will be space for the concealment of more than one interference line in the image. When the bandwidth of the coherent interference signals is known, this fact can be taken into account for proportioning the field of view in relation to the excitation. However, the condition that the image information and the interference information must together lie within the data acquisition bandwidth must be satisfied. In practice the bandwidth of the artefact signal is much smaller than that of the phase encoded signal (desired image information). Reservation of a part of the image space in the phase encoding direction for artefacts, therefore, will hardly give rise to a longer acquisition time or a lower image resolution.

The method is performed, for example by means of programmed arithmetic means in a known MRI device.

Figure 2:
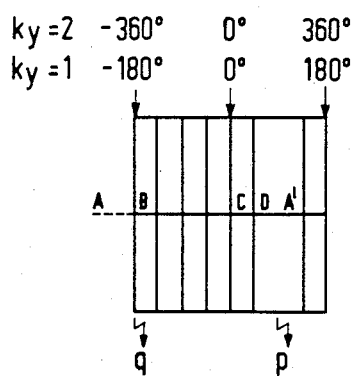
Figure 3:
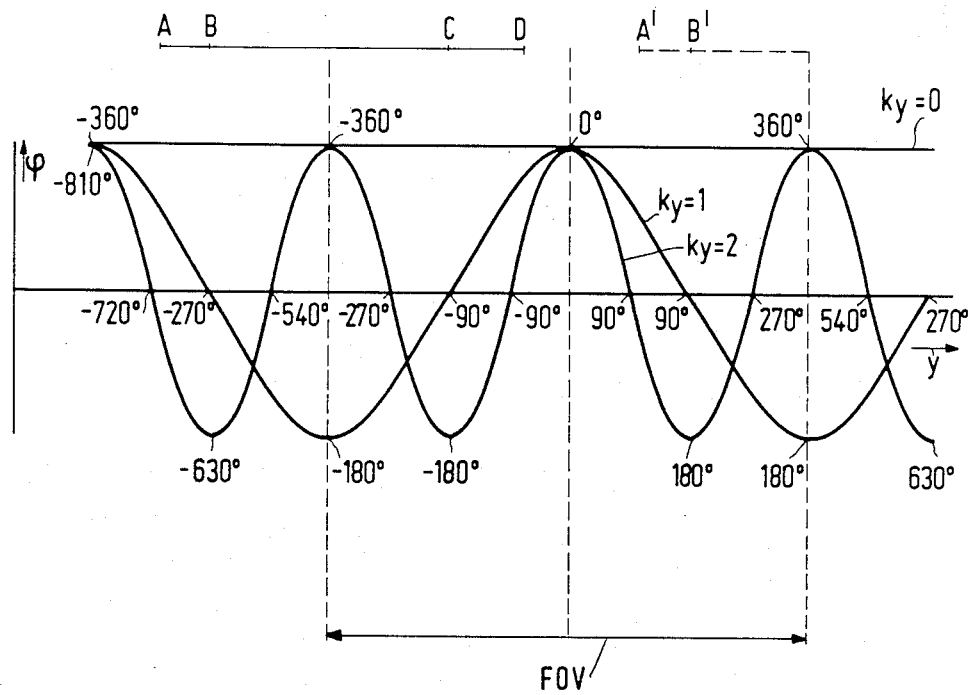

The invention will be described in detail hereinafter with reference to a drawing; therein:

FIG. 1 shows the phase shift of excited spin nuclei in the direction of the magnetic preparation gradient as a function of the distance from the isocentre, FIG. 2 shows a number of image frequency lines in the image frequency space, and FIG. 3 is a representation which corresponds to FIG. 1 and in which the field of view has been shifted in accordance with the invention.

FIG. 1 shows the phase shift of excited spin nuclei in the direction of the preparation gradient as a function of the distance from the isocentre which is situated at 0° phase shift. It is assumed that a two-dimensional spin echo measurement is concerned. For the description of such a measurement, reference is again made to said article by Locher. The phase shift $\psi$ is plotted as a function of the distance y in the direction of the preparation gradient. The reference FOV denotes the field of view in the direction of the preparation gradient; for the image frequency $k_y=1$ (one step of the preparation gradient) this is a phase range of 360°: from $-180°$ to $+180°$ via the isocentre of 0°. The variation of $\psi$ for $k_y=0$ and $k_y=2$ is also shown. The distance AD denotes an excited region of the body in the y direction, the phase shift can be derived from FIG. 1. Spin nuclei which are excited over the distance AB are outside the field of view but are interpreted as being situated from A' because of the cyclic nature of the phase shift. In order to obtain a correct image, roll correction in the image frequency space will be required. The situation shown will occur notably in the case of off-centre imaging. The object AD to be measured is asymmetrically situated with respect to the field of view FOV.

FIG. 2 shows a number of image frequency lines in the image frequency space on which the image of the nuclear magnetization distribution is mapped. Therein, the image frequency lines are denoted by references corresponding to FIG. 1 for $k_y=1$ and $k_y=2$. The contribution of coherent interference signals will be situated in the centre of the image frequency space (0°), because the interference signals are not correlated to the magnetic preparation gradient. When phase alternation is used in accordance with the method known from European Patent Application EPO155052, the interference lines will not be shifted out of the image but will appear at another location within the image due to the roll correction required for obtaining a correct image. Roll correction implies regrouping of image frequency lines. The image frequency lines situated to the right of p will be situated to the left of q.

FIG. 3 is similar to FIG. 1 and shows the field of view shifted in accordance with the invention. In the present example it is assumed that the isocentric shift amounts to ¼ FOV (modulo $2\pi$). By imparting an additional phase shift so that a ¼ FOV shift occurs it is achieved, after roll correction, that interference lines are shifted to the edge of the image. In NMR images including a synthesizer (not shown) for generating RF pulses with a limited phase modulation facility, this fact should be taken into account in the case of off-centre imaging. The surface coil should be centred at distances of ¼ FOV in synthesizers with modulation steps of $\pi/2$. Synthesizers having a quasi continuous phase modulation facility are not subject to this restriction. However, the isocentric shift prior to the measurement should at least be approximately known. This can be achieved by estimation and subsequent input into computer means of the NMR device or automatically by means of a distance sensor. ¼ FOV shift corresponds to an additional phase difference $\Delta\psi$ between successive cycles of $\pi/2$. Generally, the following relations are applicable when the method in accordance with the invention is used:

$$\psi = k_y \cdot \Delta\psi + \psi_0,$$

where $\psi$ is the excitation phase and $\psi_0$ a starting phase of the synthesizer;

$$G_y = k_y \Delta G_y,$$

where $G_y$ is the strength of the magnetic preparation gradient and $\Delta G_y$ is the increase thereof. $k_y$, being the image frequency, is an integer number. An image shift $\delta$ is obtained;

$$\delta = FOV \cdot (\Delta\psi/2\pi),$$

which follows simply from the Fourier shift theorem and the fact that the phase encoding is cyclic.

The method is not restricted to the embodiments described, and many alternatives will be apparent to those skilled in the art. For example, the method is not restricted to the spin echo measurement given by way of example, but can also be performed for any suitable multi-dimensional measurement such as 'spin-warp', "stimulated echo", "inversion recovery", etc.

What is claimed is

1. In a method of determining a nuclear magnetization distribution image from RF magnetic resonance signals which are generated in measurement cycles in a body which is situated in a steady, uniform magnetic field, first spin nuclei being excited in the body during each cycle by applying at least one RF pulse, followed by the application of at least one magnetic preparation gradient superposed on the uniform magnetic field, which one magnetic preparation gradient is varied in strength each cycle for the phase encoding of the excited spin nuclei in the direction of said one magnetic preparation gradient, after which a resonance signal is generated from the excited spin nuclei by the application of further RF pulses and/or further magnetic field gradients, said resonance signal being sampled in order to obtain signal samples which are stored in a first dimension of a data matrix, at least a second dimension of which is determined by the strength of the at least one magnetic preparation gradient, and including a phase difference in the spins of said nuclei each cycle during the excitation of the spin nuclei, in addition to said phase encoding, when an RF sensitivity center is offset in the direction of said one magnetic preparation gradient with respect to an excitation isocentre and which excited spin nuclei are thereby situated at least partly outside the field of view of the one magnetic preparation gradient, comprising wherein the additional phase difference is induced at a different level each cycle proportionate to the strength in said cycle of said magnetic preparation gradient so that, after application of correction for said offset, artefacts in the image obtained from the data matrix by Fourier transformation due to coherent interference signals occurring during the cycles are shifted to an edge of the image.

2. A method as claimed in claim 1, characterized in that in the case of bandwidth-limited coherent interference signals the field of view is proportioned with respect to a portion of the body of interest so that artefacts due to the bandwidth-limited coherent interference signals are shifted to a position at an edge of the image outside a portion of the image corresponding to the body portion of interest.

* * * * *